US009928994B2

(12) United States Patent
Shaikh et al.

(10) Patent No.: US 9,928,994 B2
(45) Date of Patent: *Mar. 27, 2018

(54) METHODS FOR DECREASING CARBON-HYDROGEN CONTENT OF AMORPHOUS CARBON HARDMASK FILMS

(71) Applicant: LAM RESEARCH CORPORATION, Fremont, CA (US)

(72) Inventors: Fayaz Shaikh, Portland, OR (US); Sirish Reddy, Hillsboro, OR (US)

(73) Assignee: LAM RESEARCH CORPORATION, Fremont, CA (US)

(*) Notice: Subject to any disclaimer, the term of this patent is extended or adjusted under 35 U.S.C. 154(b) by 152 days.

This patent is subject to a terminal disclaimer.

(21) Appl. No.: 14/612,814

(22) Filed: Feb. 3, 2015

(65) Prior Publication Data
US 2016/0225588 A1 Aug. 4, 2016

(51) Int. Cl.
C23C 16/26 (2006.01)
C23C 16/50 (2006.01)
H01J 37/32 (2006.01)
C23C 16/52 (2006.01)
C23C 16/455 (2006.01)

(52) U.S. Cl.
CPC ........ H01J 37/32449 (2013.01); C23C 16/26 (2013.01); C23C 16/455 (2013.01); C23C 16/50 (2013.01); C23C 16/52 (2013.01); H01J 37/3299 (2013.01); H01J 37/32357 (2013.01); H01J 37/32935 (2013.01)

(58) Field of Classification Search
CPC .......... C23C 16/26; C23C 16/08; C23C 16/50
See application file for complete search history.

(56) References Cited

U.S. PATENT DOCUMENTS

| 5,017,403 | A | * | 5/1991 | Pang ................. C23C 16/08 216/38 |
| 6,582,823 | B1 | * | 6/2003 | Sakhrani ............. C23C 16/30 428/412 |
| 6,939,808 | B2 | | 9/2005 | Tzou et al. |
| 7,084,071 | B1 | | 8/2006 | Dakshina-Murthy et al. |

(Continued)

OTHER PUBLICATIONS

Xu, Ming, et al., "Evolution mechanism of nanocrystalline tungsten-carbon and effects on tungsten implanted amorphous hydrogenated carbon." Journal of Applied Physics 102, 113517 (2007), pp. 1-7.*

(Continued)

*Primary Examiner* — Bret P Chen

(57) ABSTRACT

A method for depositing an amorphous carbon hardmask film includes arranging a substrate in a processing chamber, supplying a carrier gas to the processing chamber, supplying a hydrocarbon precursor to the processing chamber, supplying fluorine precursor from a group consisting of $WF_a$, $NF_b$, $SF_c$, and $F_2$ to the processing chamber, one of supplying plasma to the processing chamber or creating plasma in the processing chamber, and depositing an amorphous carbon hardmask film on the substrate. Fluorine from the fluorine precursor combines with hydrogen from the hydrocarbon precursor in gas phase reactions.

4 Claims, 3 Drawing Sheets

(56) References Cited

U.S. PATENT DOCUMENTS

| | | | |
|---|---|---|---|
| 7,666,474 B2* | 2/2010 | Li | C23C 16/32 427/249.1 |
| 7,718,081 B2 | 5/2010 | Liu et al. | |
| 7,981,810 B1 | 7/2011 | Subramonium et al. | |
| 2001/0051228 A1* | 12/2001 | Sugahara | C23C 16/26 427/489 |
| 2002/0022129 A1* | 2/2002 | Moronuki | C23C 16/30 428/408 |
| 2004/0259355 A1 | 12/2004 | Yin et al. | |
| 2005/0199013 A1* | 9/2005 | Vandroux | C03B 19/143 65/386 |
| 2005/0287771 A1* | 12/2005 | Seamons | C23C 16/505 438/482 |
| 2010/0032638 A1* | 2/2010 | Xu | H01L 45/1641 257/2 |
| 2010/0093187 A1* | 4/2010 | Lee | C23C 16/26 438/780 |
| 2010/0184294 A1 | 7/2010 | Park et al. | |
| 2010/0261040 A1* | 10/2010 | Foad | B82Y 10/00 428/800 |
| 2011/0151142 A1* | 6/2011 | Seamons | C23C 16/45523 427/579 |
| 2012/0258261 A1 | 10/2012 | Reddy et al. | |
| 2013/0280921 A1* | 10/2013 | Takeda | H01L 21/02115 438/781 |
| 2013/0316518 A1 | 11/2013 | Hollister et al. | |
| 2014/0120723 A1 | 5/2014 | Fu et al. | |
| 2014/0175617 A1 | 6/2014 | Antonelli et al. | |
| 2014/0213059 A1 | 7/2014 | Doan et al. | |
| 2015/0236159 A1* | 8/2015 | He | H01L 29/66795 257/401 |
| 2016/0027614 A1 | 1/2016 | Manna et al. | |
| 2016/0225632 A1* | 8/2016 | Shaikh | H01L 21/3081 |
| 2016/0284541 A1* | 9/2016 | Shaikh | H01L 21/02274 |

OTHER PUBLICATIONS

Wang, P., et al., "Erosion of tungsten-doped amorphous carbon films in oxygen plasma". Journal of Nuclear Materials, 420, 101-109 (2011).*

Article "Applied Materials Introduces New Hardmask Process, Saphira"; http://semimd.com/blog/2014/11/24/applied-materials-introduces-new-hardmask-process-saphira/; dated Nov. 24, 2014. pp. 1-5.

Huajun Zheng, Chunan MA, Jinaguo Huang and Guohua Li; "Plasma Enhanced Chemical Vapor Deposition Nanocrystalline Tungsten Carbide Thin Film and Its Electro-catalytic Activity"; J. Mater. Sci. Technol. vol. 21, No. 4, Mar. 10, 2005, pp. 545-548.

* cited by examiner

US 9,928,994 B2

METHODS FOR DECREASING CARBON-HYDROGEN CONTENT OF AMORPHOUS CARBON HARDMASK FILMS

FIELD

The present disclosure relates to substrate processing systems and methods, and more particularly to substrate processing systems and methods for depositing hardmask films with reduced carbon-hydrogen content on substrates.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems for performing deposition and/or etching typically include a processing chamber with a pedestal. A substrate such as a semiconductor wafer may be arranged on the pedestal. For example in a chemical vapor deposition (CVD) process, a gas mixture including one or more precursors may be introduced into the processing chamber to deposit film on the substrate or to etch the substrate. In some substrate processing systems, plasma may be used to activate chemical reactions and is referred to herein as plasma enhanced CVD (PECVD).

Amorphous carbon film may be used as a hardmask or etch stop layer during semiconductor processing. The amorphous carbon film is known as an ashable hardmask (AHM) film because the film may be removed by ashing. As aspect ratios in lithography increase, AHMs require higher etch selectivity. Current methods of forming highly selective AHMs using PECVD processes produce AHMs with varying stresses and etch selectivity.

The amorphous carbon film typically has hydrocarbon or polymer content. The carbon-hydrogen content facilitates opening the hardmask while making the film less selective to dielectric etch chemistries. In 3-D memory applications, the hardmask film should be highly selective. As a result, the carbon-hydrogen content of the film should be reduced without reducing the carbon-carbon content. This poses a challenge of depositing a film that strikes a balance between being able to be removed during the hardmask opening process and being sufficiently selective during the dielectric etching processes.

SUMMARY

A method for depositing an amorphous carbon hardmask film includes arranging a substrate in a processing chamber; supplying a carrier gas to the processing chamber; supplying a hydrocarbon precursor to the processing chamber; supplying fluorine precursor from a group consisting of $WF_a$, $NF_b$, $SF_c$, and $F_2$ to the processing chamber, wherein a, b and c are integers greater than zero; one of supplying plasma to the processing chamber or creating plasma in the processing chamber, wherein fluorine from the fluorine precursor combines with hydrogen from the hydrocarbon precursor in gas phase reactions; and depositing an amorphous carbon hardmask film on the substrate.

In other features, the processing chamber includes plasma-enhanced chemical vapor deposition (PECVD) processing chamber. The amorphous carbon hardmask film deposited on the substrate has less than 1% fluorine. The fluorine in the fluorine precursor reduces hydrogen in the gas phase reactions to reduce carbon-hydrogen content of the amorphous carbon hardmask film deposited on the substrate as compared to film deposition without the fluorine precursor. The carrier gas is selected from a group consisting of argon (Ar), molecular nitrogen ($N_2$), helium (He), and/or combinations thereof. The hydrocarbon precursor comprises $C_xH_y$, wherein x is an integer from 2 to 10 and y is an integer from 2 to 24. The hydrocarbon precursor is selected from a group consisting of methane, acetylene, ethylene, propylene, butane, cyclohexane, benzene and toluene. The fluorine precursor is supplied to the chamber at a partial fraction from 1% to 10%.

In other features, the fluorine precursor has a partial fraction of 1-30%, the hydrocarbon precursor has a partial fraction of 10% to 95% and the carrier gas has a partial fraction of 10% to 89%.

In other features, the fluorine precursor has a partial fraction of 1-10%, the hydrocarbon precursor has a partial fraction of 10% to 30% and the carrier gas has a partial fraction of 60% to 89%.

A substrate processing system for depositing an amorphous carbon hardmask film includes a processing chamber including a substrate support configured to support a substrate; a gas supply system configured to selectively supply process gas to the processing chamber; a plasma generator configured to selectively create plasma in or supply plasma to the processing chamber; a controller configured to control the gas supply system and the plasma generator and configured to: supply a carrier gas to the processing chamber; supply a hydrocarbon precursor to the processing chamber; supply fluorine precursor from a group consisting of $WF_a$, $NF_b$, $SF_c$, and $F_2$ to the processing chamber, wherein a, b and c are integers greater than zero; one of supply plasma to the processing chamber or create plasma in the processing chamber, wherein fluorine from the fluorine precursor combines with hydrogen from the hydrocarbon precursor in gas phase reactions; and deposit an amorphous carbon hardmask film on the substrate.

In other features, the processing chamber includes plasma-enhanced chemical vapor deposition (PECVD) processing chamber. The amorphous carbon hardmask film deposited on the substrate has less than 1% fluorine. The fluorine in the fluorine precursor reduces hydrogen in the gas phase reactions to reduce carbon-hydrogen content of the amorphous carbon hardmask film deposited on the substrate as compared to film deposition without the fluorine precursor. The carrier gas is selected from a group consisting of argon (Ar), molecular nitrogen ($N_2$), helium (He), and/or combinations thereof. The hydrocarbon precursor comprises $C_xH_y$, wherein x is an integer from 2 to 10 and y is an integer from 2 to 24. The hydrocarbon precursor is selected from a group consisting of methane, acetylene, ethylene, propylene, butane, cyclohexane, benzene and toluene. The fluorine precursor is supplied to the chamber at a partial fraction from 1% to 10%.

In other features, the controller is configured to deliver the fluorine precursor at a partial fraction of 1-30%, the hydrocarbon precursor at a partial fraction of 10% to 95% and the carrier gas at a partial fraction of 10% to 89%.

In other features, the controller is configured to deliver the fluorine precursor at a partial fraction of 1-10%, the hydrocarbon precursor at a partial fraction of 10% to 30% and the carrier gas at a partial fraction of 60% to 89%.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Amorphous carbon films may be used as hardmasks for etching high aspect ratio features. The amorphous carbon films have hydrocarbon content. The carbon-hydrogen content facilitates opening the hardmask while making the film less selective to dielectric etch chemistries. In 3-D memory applications, the hardmask film should be highly etch selective. Systems and methods described herein reduce the carbon-hydrogen content of the film without reducing the carbon-carbon content (densification).

The systems and methods described herein decrease the carbon-hydrogen content of the amorphous carbon film to densify the film and make the film more selective to dielectric etch chemistries. In some examples, hydrogen atoms are removed by fluorine atoms provided in the gas chemistry during PECVD deposition. As a result, the amorphous carbon film has increased carbon-carbon content and reduced carbon-hydrogen content.

Carrier gas and hydrocarbon-based precursor gas are supplied to the processing chamber. In some examples, the carrier gas may include argon (Ar), molecular nitrogen ($N_2$), helium (He), and/or combinations thereof. In some examples, the hydrocarbon precursor comprises $C_xH_y$, where x is an integer from 2 to 10 and y is an integer from 2 to 24. In other examples, the hydrocarbon precursor is selected from a group consisting of methane, acetylene, ethylene, propylene, butane, cyclohexane, benzene and toluene.

The systems and methods described herein also supply tungsten fluoride ($WF_a$), nitrogen fluoride ($NF_b$), sulfur fluoride ($SF_c$) or molecular fluoride ($F_2$) to the processing chamber, where a, b or c are integers greater than zero. In some examples, $WF_a$, $NF_b$, $SF_c$ or $F_2$ are supplied at a partial fraction in the range from 1-30%. Plasma is struck in the processing chamber (or supplied to the processing chamber) and the amorphous carbon film is deposited with reduced carbon-hydrogen content.

While $C_xF_y$ has been used to deposit fluorinated carbon, the bonding energy of C—F is relatively high such that PECVD or remote plasma CVD (RPCVD) do not break the C—F bonds and C—F is deposited in the film. In contrast, $WF_a$, $NF_b$, $SF_c$, or $F_2$ can be used such that the fluorine in consumed with hydrogen in the hydrocarbon precursor in gas phase reactions. This can be accomplished with sufficient plasma and using lower partial fractions for $WF_a$, $NF_b$, $SF_c$ or $F_2$. As a result, the amorphous carbon film that is deposited has increased carbon-carbon content and reduced carbon-hydrogen content.

Figure 1:
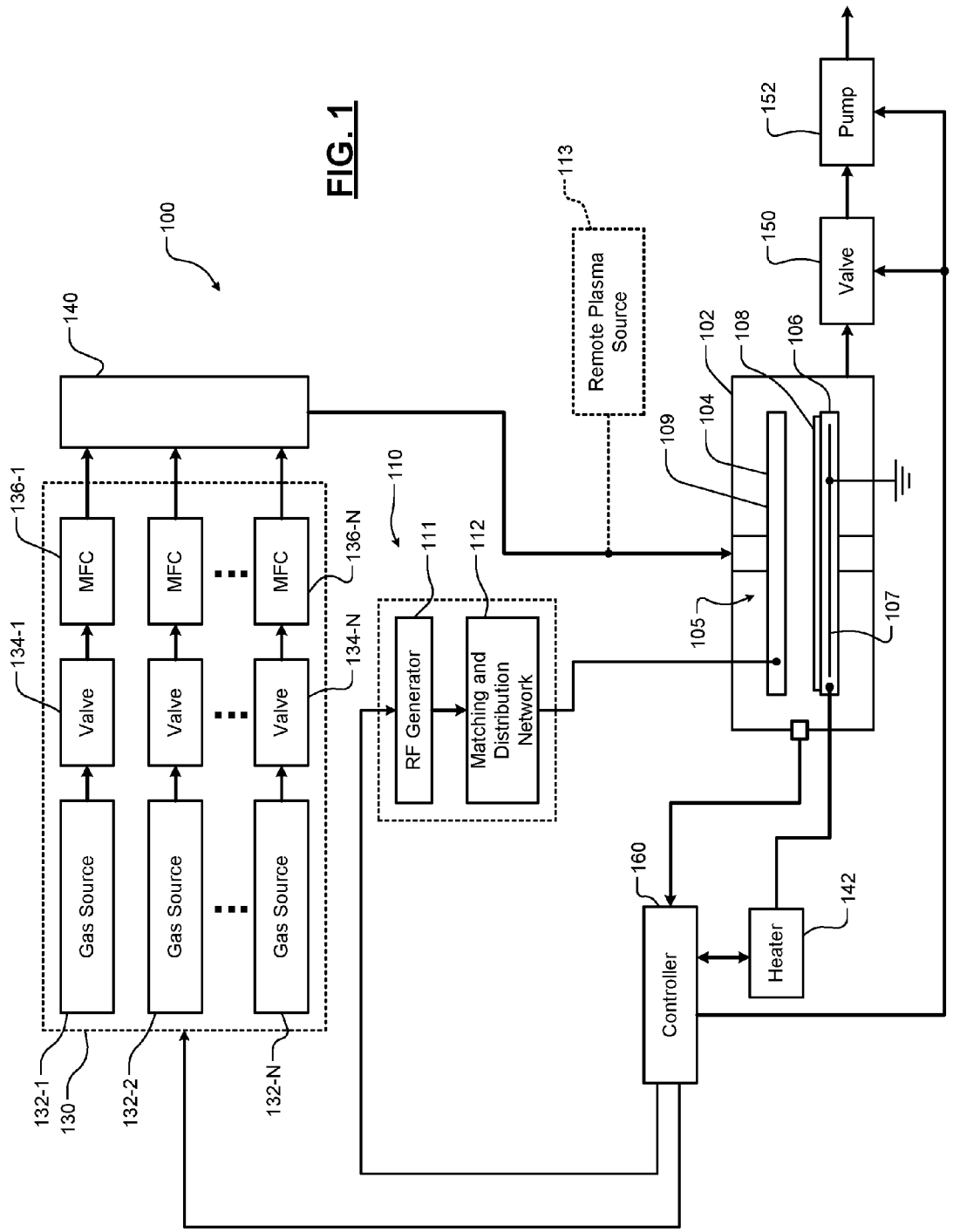
FIG. 1 is a functional block diagram illustrating an example of a substrate processing chamber for depositing an amorphous carbon hardmask film according to the present disclosure.

Referring now to FIG. 1, an example of a substrate processing system 100 for performing PECVD deposition or etching is shown. While the foregoing example relates to PECVD systems, other plasma-based processes may be used. For example only, pulsed plasma, atomic layer deposition (ALD), and/or remote-assisted plasma chemical vapor deposition (CVD) may be used. The substrate processing system 100 includes a processing chamber 102 that encloses other components of the substrate processing system 100 and contains the RF plasma. The substrate processing system 100 includes an upper electrode 104 and a pedestal 106 including a lower electrode 107. A substrate 108 is arranged on the pedestal 106 between the upper electrode 104 and the lower electrode 107.

For example only, the upper electrode 104 may include a gas distribution device 105. In some examples, the gas distribution device 105 includes a showerhead 109 that introduces and distributes process gases. Alternately, the upper electrode 104 may include a conducting plate and the process gases may be introduced in another manner. The lower electrode 107 may be arranged in a non-conductive pedestal. Alternately, the pedestal 106 may include an electrostatic chuck that includes a conductive plate that acts as the lower electrode 107.

In some examples, direct plasma is used. In this example, an RF generating system 110 generates and outputs an RF voltage to one of the upper electrode and the lower electrode. The other one of the upper electrode and the lower electrode may be DC grounded, AC grounded or floating. For example only, the RF generating system 110 may include an RF voltage generator 111 that generates the RF voltage that is fed by a matching and distribution network 112 to the upper electrode 104 or the lower electrode 107. Alternately, the plasma may be delivered from a remote plasma source 113.

An example of a gas delivery system 130 is shown in FIG. 1. A gas delivery system 130 includes one or more gas sources 132-1, 132-2, . . . , and 132-N (collectively gas sources 132), where N is an integer greater than zero. The gas sources supply one or more precursors and mixtures thereof. Vaporized precursor may also be used. The gas sources 132 are connected by valves 134-1, 134-2, . . . , and 134-N (collectively valves 134) and mass flow controllers 136-1, 136-2, . . . , and 136-N (collectively mass flow controllers 136) to a manifold 140. An output of the manifold 140 is fed to the processing chamber 102. For example only, the output of the manifold 140 is fed to the showerhead 109.

A heater 142 may be connected to a heater coil (not shown) arranged in the pedestal 106 to heat the pedestal 106. The heater 142 may be used to control a temperature of the pedestal 106 and the substrate 108. A valve 150 and pump 152 may be used to evacuate reactants from the processing chamber 102. A controller 160 may be used to control components of the substrate processing system 100. For example only, the controller 160 may be used to control flow of process, carrier and precursor gases, monitoring of process parameters such as temperature, pressure, power, etc, striking and extinguishing plasma, removal of reactants, etc.

Figure 2:
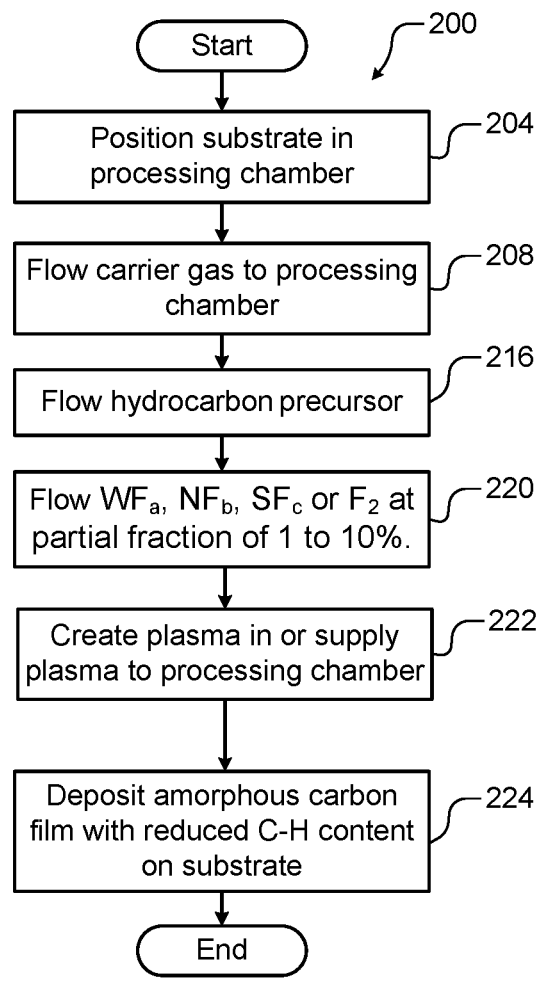
FIG. 2 is a flowchart illustrating an example of a method for depositing the amorphous carbon hardmask film according to the present disclosure.

Referring now to FIG. 2, a method 200 for depositing an amorphous carbon film with reduced carbon-hydrogen according to the present disclosure is shown. At 204, a substrate is positioned in a processing chamber such as a PECVD processing chamber. At 208, carrier gas is supplied to the processing chamber. In some examples, the carrier gas includes argon (Ar), molecular nitrogen ($N_2$), helium (He), and/or combinations thereof.

At 216, a hydrocarbon precursor is supplied to the processing chamber. In some examples, the hydrocarbon precursor comprises $C_xH_y$ where x is an integer from 2 to 10 and y is an integer from 2 to 24. In other examples, the hydrocarbon precursor is selected from a group consisting of methane, acetylene, ethylene, propylene, butane, cyclohexane, benzene and toluene.

At 220, $WF_a$, $NF_b$, $SF_c$, or $F_2$ is supplied to the processing chamber at a predetermined partial fraction to the processing chamber.

At 222, plasma is struck in the processing chamber. In some examples, the supplied fluoride from $WF_a$, $NF_b$, $SF_c$, or $F_2$ is consumed with hydrogen in the hydrocarbon precursor in gas phase reactions. As a result, the film has increased carbon-carbon content and reduced carbon-hydrogen content.

At 224, an amorphous carbon film with reduced carbon-hydrogen content is deposited on the substrate.

There is little or no fluorine content (e.g. <1%) in the resulting amorphous carbon film. In some examples, the fluorine content is essentially zero and cannot be measured. The amorphous carbon film with reduced carbon-hydrogen content may be used as a hard mask during substrate processing.

The foregoing sets forth examples ranges for process parameters for an amorphous carbon hardmask film with reduced carbon-hydrogen content according to the present disclosure. The processing chamber temperature may be set to a temperature range from 400° C.-650° C. and pressure may be set from 0.2 Torr to 9 Torr. The fluorine precursor $WF_a$, $NF_b$, $SF_c$, or $F_2$ is supplied at a partial fraction of 1-30%. The hydrocarbon precursor is supplied at a partial fraction of 10% to 95%. The hydrocarbon precursor may include may include $CH_4$. The carrier gas is supplied at a partial fraction of 10% to 89%. High frequency power may be set to a range from 100 W to 6000 W. Low frequency power may be set to a range from 100 W to 3000 W.

In other examples, the partial fraction of the hydrocarbon precursor is supplied at a partial fraction of 10% to 30%. The hydrocarbon precursor may include $CH_4$. The carrier gas is supplied at a partial fraction from 60% to 89% and may include $He/Ar/N_2$. The fluorine precursor is supplied at a partial fraction from 1% to 10%. The fluorine precursor may include $WF_a$.

Figure 3:
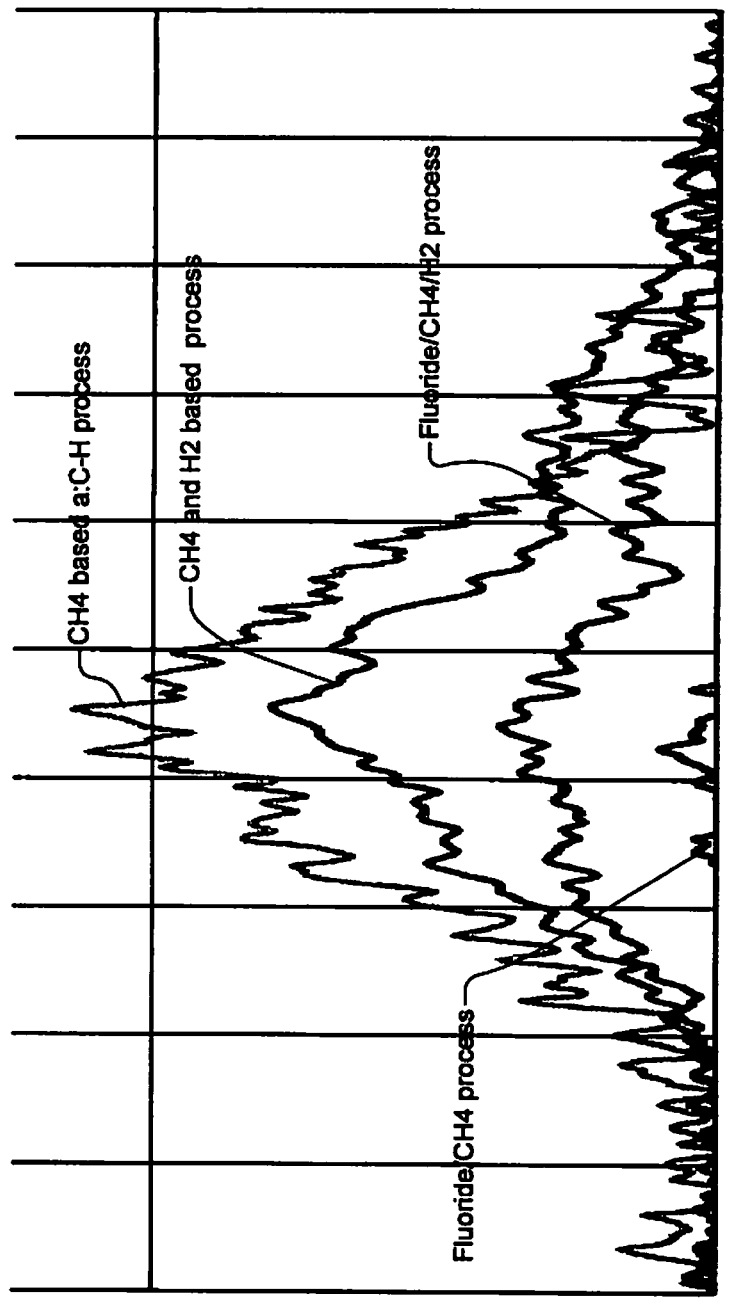
FIG. 3 is a graph illustrating various examples of carbon-hydrogen suppression in films made according to the prior art and the present invention.

Referring now to FIG. 3, relative carbon-hydrogen content in various amorphous carbon films is shown. A highest carbon-hydrogen content is found for a conventional $CH_4$-based amorphous carbon film. A $CH_4/H_2$-based amorphous carbon film has a lower carbon-hydrogen content. A fluoride/$CH_4/H_2$-based amorphous carbon film has slightly lower carbon-hydrogen content. A fluoride/$CH_4$-based amorphous carbon film has the lowest carbon-hydrogen content in this group of examples.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A OR B OR C), using a non-exclusive logical OR, and should not be construed to mean "at least one of A, at least one of B, and at least one of C." It should be understood that one or more steps within a method may be executed in different order (or concurrently) without altering the principles of the present disclosure.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A method for depositing an amorphous carbon hardmask film, comprising:
arranging a substrate in a processing chamber;
supplying a carrier gas to the processing chamber;
supplying a hydrocarbon precursor to the processing chamber, wherein the hydrocarbon precursor includes $CH_4$;
supplying fluorine precursor from a group consisting of $WF_a$, $NF_b$, $SF_c$, and $F_2$ to the processing chamber, wherein a, b and c are integers greater than zero, and wherein the fluorine precursor is supplied to the processing chamber at a partial fraction from 1% to 10%; and
one of supplying plasma to the processing chamber or creating plasma in the processing chamber while the carrier gas, the hydrocarbon precursor, and the fluorine precursor are present within the processing chamber to cause a gas phase reaction in which fluorine from the fluorine precursor is consumed with hydrogen from the hydrocarbon precursor to remove the hydrogen from the hydrocarbon precursor such that fluorine content of an amorphous carbon hardmask film deposited on the substrate is essentially 0.

2. The method of claim 1, wherein the processing chamber includes plasma-enhanced chemical vapor deposition (PECVD) processing chamber.

3. The method of claim 1, wherein the fluorine in the fluorine precursor reduces hydrogen in the gas phase reactions to reduce carbon-hydrogen content of the amorphous carbon hardmask film deposited on the substrate as compared to film deposition without the fluorine precursor.

4. The method of claim 1, wherein the carrier gas is selected from a group consisting of argon (Ar), molecular nitrogen ($N_2$), helium (He), and/or combinations thereof.

* * * * *